(12) United States Patent
Berzins et al.

(10) Patent No.: US 9,564,897 B1
(45) Date of Patent: Feb. 7, 2017

(54) APPARATUS FOR LOW POWER HIGH SPEED INTEGRATED CLOCK GATING CELL

(71) Applicants: Matthew Berzins, Cedar Park, TX (US); James Jung Lim, Austin, TX (US)

(72) Inventors: Matthew Berzins, Cedar Park, TX (US); James Jung Lim, Austin, TX (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/013,659

(22) Filed: Feb. 2, 2016

Related U.S. Application Data

(60) Provisional application No. 62/237,777, filed on Oct. 6, 2015.

(51) Int. Cl.
| | |
|---|---|
| H03K 19/00 | (2006.01) |
| H03K 3/03 | (2006.01) |
| H03K 3/012 | (2006.01) |
| H03K 3/037 | (2006.01) |
| H03K 3/356 | (2006.01) |
| H03K 17/30 | (2006.01) |

(52) U.S. Cl.
CPC .......... *H03K 19/0016* (2013.01); *H03K 3/012* (2013.01); *H03K 3/0372* (2013.01); *H03K 3/356052* (2013.01); *H03K 17/30* (2013.01); *H03K 19/0013* (2013.01)

(58) Field of Classification Search
CPC .. H03K 19/096; H03K 23/58; H03K 19/0016; H03K 19/0013; H03K 2217/0054; H03K 3/356052; H03K 3/356147
See application file for complete search history.

(56) References Cited

U.S. PATENT DOCUMENTS

| | | | |
|---|---|---|---|
| 4,527,075 A | 7/1985 | Zbinden | |
| 5,189,319 A | 2/1993 | Fung et al. | |
| 5,410,263 A | 4/1995 | Waizman | |
| 6,194,952 B1 * | 2/2001 | Shigehara | H03K 17/165 327/436 |
| 6,456,133 B1 | 9/2002 | Nair et al. | |
| 6,771,136 B1 | 8/2004 | Reynolds | |

(Continued)

OTHER PUBLICATIONS

R. Bhutada et al., Complex clock gating with integrated clock gating logic cell, Design & Technology of Int. Syst., 2007. pp. 164-169 DOI:10.1109/DTIS.2007.4449512.

(Continued)

*Primary Examiner* — Vibol Tan
(74) *Attorney, Agent, or Firm* — The Farrell Law Firm, P.C.

(57) ABSTRACT

An apparatus for an integrated clock gating cell is provided. The apparatus includes a logic gate that receives an unbuffered enable signal (E), a scan test enable signal (SE), and outputs an inverted enable signal (EN); a first transmission gate that receives E, SE, and EN; a second transmission gate that is connected to the first transmission gate and receives a clock signal (CK) and an enabled and inverted clock signal (ECKN); a first transistor having terminals connected to a power supply voltage (VDD), an output of the logic gate, and the first transmission gate respectively; a second transistor including terminals connected to the first transmission gate and VDD respectively; and a latch including terminals connected to the second transmission gate and the second transistor respectively.

19 Claims, 1 Drawing Sheet

(56) References Cited

U.S. PATENT DOCUMENTS

| | | |
|---|---|---|
| 7,109,776 B2 | 9/2006 | Tschanz et al. |
| 7,138,842 B2 * | 11/2006 | Padhye ................ H03K 3/0375 327/203 |
| 7,391,250 B1 * | 6/2008 | Chuang ................ H03K 3/0375 326/104 |
| 7,487,417 B2 | 2/2009 | Branch et al. |
| 7,541,832 B1 | 6/2009 | Clark et al. |
| 7,570,094 B2 | 8/2009 | Mnich |
| 7,596,732 B2 | 9/2009 | Branch et al. |
| 7,622,955 B2 | 11/2009 | Vilangudipitchai et al. |
| 7,639,057 B1 | 12/2009 | Su |
| 7,671,651 B2 | 3/2010 | Kim |
| 7,772,889 B2 | 8/2010 | Naffziger |
| 7,868,677 B2 | 1/2011 | Jain |
| 7,902,878 B2 | 3/2011 | Saint-Laurent et al. |
| 8,004,331 B2 | 8/2011 | Li et al. |
| 8,030,982 B2 | 10/2011 | Datta et al. |
| 8,058,905 B1 | 11/2011 | Klein et al. |
| 8,384,457 B2 | 2/2013 | Ozgun et al. |
| 9,000,804 B2 | 4/2015 | Priel et al. |
| 9,018,995 B2 | 4/2015 | Subramani et al. |
| 9,362,910 B2 * | 6/2016 | Gurumurthy ...... H03K 19/0016 |
| 2014/0075233 A1 | 3/2014 | Bartling et al. |
| 2014/0184271 A1 | 7/2014 | Gurumurthy et al. |
| 2014/0189453 A1 | 7/2014 | Gurumurthy |
| 2015/0070063 A1 | 3/2015 | Gurumurthy et al. |
| 2015/0145577 A1 | 5/2015 | Berzins et al. |

OTHER PUBLICATIONS

J. A. Galvis, Low-power flip-flop using internal clock gating and adaptive body bias, University of South Florida Scholar Commons, Graduate Theses and Dissertations, Ph.D. Dissertation, University of South Florida, 2006, pp. 1-161 http://scholarcommons.usf.edu/cgi/viewcontent.cgi?article=3527&context=etd.

S. Wimer et al., The optimal fan-out of clock network for power minimization by adaptive gating, IEEE Transactions on Very Large Scale Integration (VLSI) Systems, 2011, pp. 1772-1780, VLSI Systems, IEEE Trans. on, vol. 20, No. 10, DOI:10.1109/TVLSI.2011.2162861.

I. Varun et al., Ultra-low power nand based multiplexer and flip-flop, 2013 Nirma University International Conference on Engineering (NUICONE) NUiCONE, 2013 Int. Conf., pp. 1-5 DOI:10.1109/NUiCONE.2013.6780110.

* cited by examiner

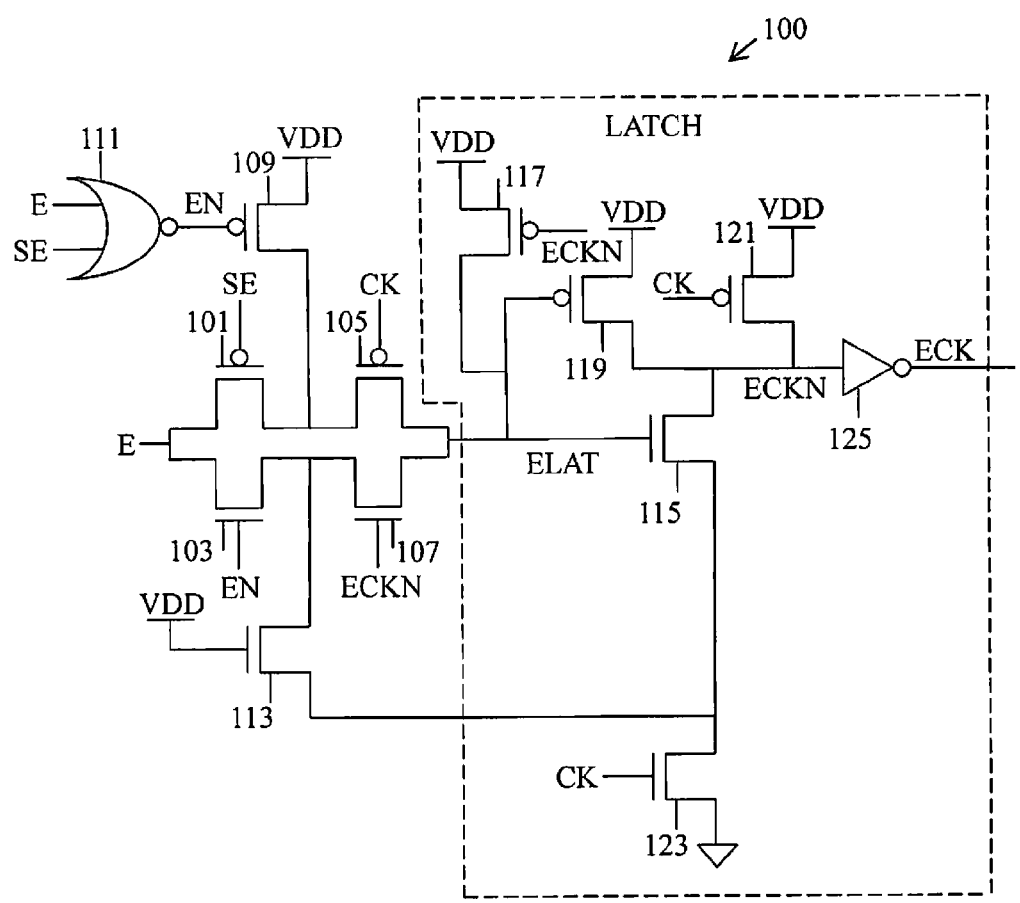

APPARATUS FOR LOW POWER HIGH SPEED INTEGRATED CLOCK GATING CELL

PRIORITY

This application claims priority under 35 U.S.C. §119(e) to a U.S. Provisional Patent Application filed on Oct. 6, 2015 in the United States Patent and Trademark Office and assigned Ser. No. 62/237,777, the entire contents of which are incorporated herein by reference.

BACKGROUND OF THE DISCLOSURE

Field of the Disclosure

The present disclosure relates generally to an apparatus for an integrated clock gating cell (ICG), and more particularly, to an apparatus for a low power, high speed integrated clock gating cell.

Description of the Related Art

An integrated clock gating cell (ICG) reduces power consumption in circuits that use a clock signal by propagating (i.e., enabling) the clock signal only when it is required by a circuit. An ICG may be implemented using a static complementary metal oxide semiconductor (CMOS) design technique, which includes p-channel MOS (PMOS) transistors and n-channel MOS (NMOS) transistors.

A dynamic version of an ICG was introduced to improve (i.e., reduce) the setup time of the ICG.

In a dynamic logic gate, when a clock signal is low (e.g., 0 volts), a PMOS transistor is turned on to precharge an output node of the logic gate to a high voltage (e.g., a supply voltage VDD) before it is determined (e.g., evaluated) what the output of the logic gate should be, based on the inputs to the logic gate.

When the clock signal is high (e.g., VDD), the PMOS transistor is turned off and an NMOS transistor is turned on to evaluate what the output of the logic gate should be. That is, it is determined whether the output node should either be discharged to a low voltage (e.g., 0 volts) if the output of the logic gate should be low or left alone to retain the precharged voltage if the output of the logic gate should be high.

Since the precharged voltage is susceptible to being lost due to leakage or accidental discharge, a static logic gate may be used after each dynamic stage to ensure retention of the logic value. Such a design is commonly referred to as Domino logic, because the stages are evaluated one at a time, in order, like falling dominoes.

A drawback of a dynamic ICG of the related art is that precharging is performed each time a clock signal goes low, resulting in power being consumed, even when the clock signal is not propagated (i.e., not enabled).

Another drawback of a dynamic ICG of the related art is that the ICG uses both a clock signal and an inverted version of the clock signal to propagate enabled data to a static stage.

An inverted clock consumes power costs, because it switches the clock every time the non-inverted clock signal switches.

SUMMARY

An integrated clock gating cell is provided. The integrated clock gating cell includes a logic gate, including a first input to receive an unbuffered enable signal (E), a second input to receive a scan test enable signal (SE), and an output that generates an inverted enable signal (EN); a first transmission gate, including a first terminal for receiving E, a second for receiving SE, a third terminal for receiving EN, a fourth terminal, and a fifth terminal; a second transmission gate, including a first terminal connected to the fourth terminal of the first transmission gate, a second terminal connected to the fifth terminal of the first transmission gate, a third terminal for receiving a clock signal (CK), a fourth terminal for receiving an enabled and inverted clock signal (ECKN), and a fifth terminal; and a first transistor, including a first terminal connected to a power supply voltage (VDD), a second terminal connected to the output of the logic gate, and a third terminal connected to the fourth terminal of the first transmission gate; a second transistor, including a first terminal connected to the fifth terminal of the first transmission gate, a second terminal connected to VDD, and a third terminal; and a latch, including a first terminal connected to the fifth terminal of the second transmission gate, a second terminal connected to the third terminal of the second transistor, and a third terminal.

An integrated clock gating cell is provided. The integrated clock gating cell includes a logic gate, including a first input to receive E, a second input to receive SE, and an output that generates EN; a first transistor, including a first terminal for receiving E, a second for receiving SE, and a third terminal; a second transistor, including a first terminal, a second terminal for receiving EN, and a third terminal connected to the first terminal of the first transistor; a third transistor, including a first terminal connected to the third terminal of the first transistor, a second terminal for receiving CK, and a third terminal; a fourth transistor, including a first terminal connected to the first terminal of the second transistor, a second terminal for receiving ECKN, and a third terminal connected to the third terminal of the third transistor; a fifth transistor, including a first terminal connected to a VDD, a second terminal connected to the output of the logic gate, and a third terminal connected to the third terminal of the first transistor; a sixth transistor, including a first terminal connected to the first terminal of the second transistor, a second terminal connected to VDD, and a third terminal; a seventh transistor, including a first terminal, a second terminal connected to the third terminal of the third transistor, and a third terminal connected to the third terminal of the sixth transistor; an eighth transistor, including a first terminal connected to VDD, a second terminal for receiving ECKN, and a third terminal connected to the second terminal of the seventh transistor; a ninth transistor, including a first terminal connected to VDD, a second terminal connected to the second terminal of the seventh transistor, and a third terminal connected to the first terminal of the seventh transistor; a tenth transistor, including a first terminal connected to VDD, a second terminal for receiving CK, and a third terminal connected to the first terminal of the seventh transistor; an eleventh transistor, including a first terminal connected to the third terminal of the seventh transistor, a second terminal for receiving CK, and a third terminal connected to a ground; and an inverter, including an input connected to the third terminal of the tenth transistor, and an output for generating ECK.

BRIEF DESCRIPTION OF THE DRAWINGS

The above and other aspects, features, and advantages of certain embodiments of the present disclosure will be more apparent from the following detailed description, taken in conjunction with the accompanying drawings, in which:

FIG. 1 is a schematic diagram of an ICG according to an embodiment of the present disclosure.

DETAILED DESCRIPTION OF EMBODIMENTS OF THE PRESENT DISCLOSURE

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout the specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the spirit and the scope of the present disclosure.

Although terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of additional one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

An ICG of the related art uses a logic gate (e.g., an OR gate) to combine a clock gating enable signal with a scan test mode enable signal (SE). This increases the setup time for the enable signal. Thus, there is a need for an ICG that exhibits one or both of a low enabled off clock power consumption, and a small setup time.

In an embodiment of the present disclosure, setup time for an enable signal (E) is reduced by passing E to latch directly instead of going through a logic gate. In addition, power consumption is reduced by eliminating the need for a complimentary clock signal and an inverting buffer to generate the same.

An ICG according to an embodiment of the present disclosure includes a latch node and a NAND gate. In addition, an embodiment of the present disclosure includes a sampling multiplexer that samples an enable signal without using a logic gate to logically combine the enable signal with a scan test mode enable. This enables an embodiment of the present disclosure to reduce the setup time of the enable signal, reduce the time from the enable signal to an enabled clock signal, and reduce power consumption.

FIG. 1 is a schematic diagram of an ICG 100 that reduces setup time of an enable signal (E) and reduces power consumption due to a clock signal (CK).

Referring to FIG. 1, the ICG 100 includes a first PMOS transistor 101, including a source, a gate, and a drain. A first NMOS transistor 103, including a source, a gate, and a drain, is connected to the first PMOS transistor 101 to form a first transmission gate of a latch function. The source of the first PMOS transistor 101 is connected to the drain of the first NMOS transistor 103, where an unbuffered enable signal (E) is applied directly to the source and drain of the first PMOS transistor 101 and the first NMOS transistor 103, respectively. By doing so, the set up time of E is reduced as compared to an ICG that does not apply an unbuffered enable signal directly to a transmission gate of a latch function, but combines an enable signal with a test signal using a logic gate and then provides the result to a transmission gate of a latch function. Thus, the ICG 100 eliminates the logic gate and its associated propagation delay to reduce the setup time of E.

A second PMOS transistor 105 includes a gate, a drain, and a source connected to the drain of the first PMOS transistor 101, a gate, and a drain. A second NMOS transistor 107, includes a gate, a drain connected to the source of the first NMOS transistor 103, and a source connected to the drain of the second PMOS transistor 105, where the second PMOS transistor 105 and the second NMOS transistor 107 form a second transmission gate of a latch function. A clock signal (CK) is applied to the gate of the second PMOS transistor 105.

The transmission gates formed by the first PMOS transistor 101, the first NMOS transistor 103, the second PMOS transistor 105, and the second NMOS transistor 107 are used as latched transistors in a multiplexer for sharing the enable signal (E).

The multiplexer samples the enable signal (E) and reduces the setup time for the enable signal as compared to using a logic gate to combine an enable signal and a test enable signal.

A third PMOS transistor 109 includes a source connected to the power supply voltage (e.g., VDD), a gate, and a drain connected to the drain and source of the first PMOS transistor 101 and the second PMOS transistor 105 respectively.

A NOR gate 111 includes a first input for receiving the enable signal E, a second input for receiving a scan test enable signal (SE), and an output connected to the gate of the third PMOS transistor 109 for providing the result of a NOR operation on E and SE (i.e., EN).

SE is also provided to the gate of the first PMOS transistor 101, and EN is provided to the gate of the first NMOS transistor 103. Thus, SE is logically combined with E using transmission gates without using a logic gate. The result is that E and its combination with SE are provided with a reduced setup time as using a logic gate.

The third PMOS transistor 109 charges the drain and source of the first PMOS transistor 101 and the second PMOS transistor 105, respectively, only when EN is low (i.e., only when E is high and SE is low), as compared to the related art that precharges a node on every low cycle of a clock signal. The third PMOS transistor 109 passes an input when EN is low, which is not equivalent to pre-charging. This ICG 100 only precharges the ECKN node, but does not precharge any other node.

A third NMOS transistor 113 includes a source, a drain connected to the source and drain of the first NMOS transistor 103 and the second NMOS transistor 107 respectively, a gate connected to the power supply voltage (e.g., VDD). Since the gate of the third PMOS transistor 113 is connected to the power supply voltage, it is always on and acts like a resistor, where its resistance is the resistance of its channel.

A fourth NMOS transistor 115 includes a drain, a gate connected to the drain and source of the second PMOS transistor 105 and the second NMOS transistor 107 respectively, and a source connected to the source of the third NMOS transistor 113 to form a latch. When SE and the clock signal CK are low, the enable signal E is passed via the transmission gates formed by the first PMOS transistor 101, the first NMOS transistor 103, the second PMOS transistor 105, and the second NMOS transistor 107 to the latch and is referred to as ELAT.

A fourth PMOS transistor 117 includes a gate, a source connected to the power supply voltage (e.g., VDD), and a drain connected to the gate of the fourth NMOS transistor 115. When the gate of the fourth PMOS transistor 117 is low, the fourth PMOS transistor 117 precharges ELAT. Since the fourth PMOS transistor 117 is not controlled by the clock signal (CK), it is not precharged on every low cycle of the clock signal CK. Thus, power consumption is reduced as compared to a circuit that precharges a latch node on every low cycle of a clock signal.

A fifth PMOS transistor 119 includes a source connected to the power supply voltage (e.g., VDD), a gate connected to the gate of the fourth NMOS transistor 115 for receiving ELAT, and a drain connected to the drain of the fourth NMOS transistor 115.

A sixth PMOS transistor 121 includes a source connected to the power supply voltage (e.g., VDD), a gate for receiving the clock signal CK, and a drain connected to the drain of the fourth NMOS transistor 115.

A fifth NMOS transistor 123 includes a drain connected to the source of the fourth NMOS transistor 115, a gate for receiving the clock signal CK, and a source connected to a ground potential.

The fourth NMOS transistor 115, the fifth NMOS transistor 123, the fifth PMOS transistor 119, and the sixth PMOS transistor 121 form a Domino logic AND gate, where the clock signal CK precharges the output ECKN (e.g., an inverse of the clock signal CK that has been enabled by the enable signal E via ELAT) of the AND gate when the clock signal CK is low, and the fifth NMOS transistor 123 discharges ELAT when the clock signal CK is high.

The Domino logic AND gate eliminates the need for a complimentary clock signal and an associated clock inverter. This reduces both input clock loading and power consumption due to clock switching.

An ICG of the related art uses a complimentary clock signal, which increases power consumption due to clock signal switching, and using a logic gate to combine an enable signal with a test enable signal, which increases the setup time of the enable signal.

The related art pre-charges more than one set of nodes when the clock signal is low, whereas an embodiment of the present disclosure only precharges one node. Thus, an embodiment of the present disclosure exhibits smaller clock signal loading than does an ICG of the related art.

The output ECKN of the AND gate is provided to the gate of the second NMOS transistor 107 and the gate of the fourth PMOS transistor 117.

An inverter 125 includes an input connected to the output ECKN of the Domino logic AND gate, and an output, which is the enabled clock signal (ECK). The inverter 125 combined with the Domino logic AND gate forms a NAND gate.

In operation, when ELAT is low and the clock signal CK switches from low to high, ECKN will not be discharged but will retain its high precharge, the high ECKN signal will turn on the second NMOS transistor 107, and CK will turn on the fifth NMOS transistor 123, which will hold ELAT low (e.g., 0 volts).

If ELAT is high and the clock signal CK switches from low to high, E_LAT will cause ECKN to go low. However, ECKN is initially high when the clock signal CK initially switches from low to high, because CK precharges ECKN to high when CK is low. This will cause ELAT to be discharged. Since the resistance of the always turned-on third NMOS transistor 113 is in the discharging path, ELAT is ensured to latch properly.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An integrated clock gating cell, comprising:
   a logic gate, including a first input to receive an unbuffered enable signal (E), a second input to receive a scan test enable signal (SE), and an output that generates an inverted enable signal (EN);
   a first transmission gate, including a first terminal for receiving E, a second terminal for receiving SE, a third terminal for receiving EN, a fourth terminal, and a fifth terminal;
   a second transmission gate, including a first terminal connected to the fourth terminal of the first transmission gate, a second terminal connected to the fifth terminal of the first transmission gate, a third terminal for receiving a clock signal (CK), a fourth terminal for receiving an enabled and inverted clock signal (ECKN), and a fifth terminal; and
   a first transistor, including a first terminal connected to a power supply voltage (VDD), a second terminal connected to the output of the logic gate, and a third terminal connected to the fourth terminal of the first transmission gate;
   a second transistor, including a first terminal connected to the fifth terminal of the first transmission gate, a second terminal connected to VDD, and a third terminal; and
   a latch, including a first terminal connected to the fifth terminal of the second transmission gate, a second terminal connected to the third terminal of the second transistor, and a third terminal.

2. The integrated clock gating cell of claim 1, wherein the logic gate is a NOR gate.

3. The integrated clock gating cell of claim 1, wherein the first transistor is a p-channel metal oxide semiconductor (PMOS) transistor and the second transistor is an n-channel metal oxide semiconductor (NMOS) transistor.

4. The integrated clock gating cell of claim 1, wherein the first and third terminals of the first transistor and the second transistor are either a source terminal or a drain terminal, and wherein the second terminal of the first transistor and the second transistor are each a gate terminal.

5. The integrated clock gating cell of claim 1, wherein the first transmission gate is comprised of:
a third transistor, including a first terminal for receiving E, a second terminal for receiving SE, and a third terminal; and
a fourth transistor, including a first terminal, a second terminal for receiving EN, and a third terminal connected to the first terminal of the third transistor.

6. The integrated clock gating cell of claim 5, wherein the third transistor is a p-channel metal oxide semiconductor (PMOS) transistor and the fourth transistor is an n-channel metal oxide semiconductor (NMOS) transistor.

7. The integrated clock gating cell of claim 5, wherein the first and third terminals of the third transistor and the fourth transistor are either a source terminal or a drain terminal, and wherein the second terminal of the third transistor and the fourth transistor are each a gate terminal.

8. The integrated clock gating cell of claim 1, wherein the second transmission gate is comprised of:
a fifth transistor, including a first terminal connected to the third terminal of the third transistor, a second terminal for receiving a clock signal (CK), and a third terminal;
a sixth transistor, including a first terminal connected to the first terminal of the fourth transistor, a second terminal for receiving an enabled clock signal (ECKN), and a third terminal connected to the third terminal of the fifth transistor.

9. The integrated clock gating cell of claim 8, wherein the fifth transistor is a p-channel metal oxide semiconductor (PMOS) transistor and the sixth transistor is an n-channel metal oxide semiconductor (NMOS) transistor.

10. The integrated clock gating cell of claim 1, wherein the first and third terminals of the fifth transistor and the sixth transistor are either a source terminal or a drain terminal, and wherein the second terminal of the fifth transistor and the sixth transistor are each a gate terminal.

11. The integrated clock gating cell of claim 1, wherein the latch is comprised of:
a third transistor, including a first terminal, a second terminal connected to the fifth terminal of the second transmission gate, and a third terminal connected to the third terminal of the second transistor;
a fourth transistor, including a first terminal connected to VDD, a second terminal for receiving ECKN, and a third terminal connected to the fifth terminal of the second transmission gate;
a fifth transistor, including a first terminal connected to VDD, a second terminal connected to the fifth terminal of the second transmission gate, and a third terminal connected to the first terminal of the third transistor;
a sixth transistor, including a first terminal connected to VDD, a second terminal for receiving CK, and a third terminal connected to the first terminal of the third transistor;
a seventh transistor, including a first terminal connected to the third terminal of the third transistor, a second terminal for receiving CK, and a third terminal connected to a ground; and
an inverter, including an input connected to the third terminal of the tenth transistor, and an output for generating an enabled clock signal (ECK).

12. The integrated clock gating cell of claim 11, wherein the fourth transistor, the fifth transistor, and the sixth transistor are each a p-channel metal oxide semiconductor (PMOS) transistor and the seventh transistor and the eleventh transistor are each an n-channel metal oxide semiconductor (NMOS) transistor.

13. The integrated clock gating cell of claim 11, wherein the first and third terminals of the third transistor, the fourth transistor, the fifth transistor, the sixth transistor, and the seventh transistor are either a source terminal or a drain terminal, and wherein the second terminal of the third transistor, the fourth transistor, the fifth transistor, the sixth transistor, and the seventh transistor are each a gate terminal.

14. An integrated clock gating cell, comprising:
a logic gate, including a first input to receive an unbuffered enable signal (E), a second input to receive a scan test enable signal (SE), and an output that generates an inverted enable signal (EN);
a first transistor, including a first terminal for receiving E, a second terminal for receiving SE, and a third terminal;
a second transistor, including a first terminal, a second terminal for receiving EN, and a third terminal connected to the first terminal of the first transistor;
a third transistor, including a first terminal connected to the third terminal of the first transistor, a second terminal for receiving a clock signal (CK), and a third terminal;
a fourth transistor, including a first terminal connected to the first terminal of the second transistor, a second terminal for receiving an enabled clock signal (ECKN), and a third terminal connected to the third terminal of the third transistor;
a fifth transistor, including a first terminal connected to a power supply voltage (VDD), a second terminal connected to the output of the logic gate, and a third terminal connected to the third terminal of the first transistor;
a sixth transistor, including a first terminal connected to the first terminal of the second transistor, a second terminal connected to VDD, and a third terminal;
a seventh transistor, including a first terminal, a second terminal connected to the third terminal of the third transistor, and a third terminal connected to the third terminal of the sixth transistor;
an eighth transistor, including a first terminal connected to VDD, a second terminal for receiving ECKN, and a third terminal connected to the second terminal of the seventh transistor;
a ninth transistor, including a first terminal connected to VDD, a second terminal connected to the second terminal of the seventh transistor, and a third terminal connected to the first terminal of the seventh transistor;
a tenth transistor, including a first terminal connected to VDD, a second terminal for receiving CK, and a third terminal connected to the first terminal of the seventh transistor;

an eleventh transistor, including a first terminal connected to the third terminal of the seventh transistor, a second terminal for receiving CK, and a third terminal connected to a ground; and an inverter, including an input connected to the third terminal of the tenth transistor, and an output for generating an enabled clock signal (ECK).

15. The integrated clock gating cell of claim 14, wherein the logic gate is a NOR gate.

16. The integrated clock gating cell of claim 14, wherein the first transistor, the third transistor, the fifth transistor, the eighth transistor, the ninth transistor, and the tenth transistor are each a p-channel metal oxide semiconductor (PMOS) transistor.

17. The integrated clock gating cell of claim 14, wherein the second transistor, the fourth transistor, the sixth transistor, the seventh transistor, and the eleventh transistor are each an n-channel metal oxide semiconductor (NMOS) transistor.

18. The integrated clock gating cell of claim 16, wherein the first and third terminal of each PMOS transistor is either a source terminal or a drain terminal, and wherein the second terminal of each transistor is a gate terminal.

19. The integrated clock gating cell of claim 17, wherein the first and third terminal of each NMOS transistor is either a source terminal or a drain terminal, and wherein the second terminal of each transistor is a gate terminal.

* * * * *